United States Patent [19]

Cherne et al.

[11] Patent Number: 5,293,052
[45] Date of Patent: Mar. 8, 1994

[54] SOT CMOS DEVICE HAVING DIFFERENTIALLY DOPED BODY EXTENSION FOR PROVIDING IMPROVED BACKSIDE LEAKAGE CHANNEL STOP

[75] Inventors: Richard D. Cherne, West Melbourne; James F. Buller, Indialantic; William H. Speece, Palm Bay, all of Fla.

[73] Assignee: Harris Corporation, Melbourne, Fla.

[21] Appl. No.: 855,834

[22] Filed: Mar. 23, 1992

[51] Int. Cl.$^5$ .................... H01L 27/01; H01L 27/12; H01L 29/04; H01L 29/36
[52] U.S. Cl. ........................ 257/349; 257/66; 257/347; 257/655
[58] Field of Search ............. 257/66, 347, 348, 349, 257/352, 353, 354, 925, 655, 657

[56] References Cited

U.S. PATENT DOCUMENTS

| | | |
|---|---|---|
| 4,054,894 | 10/1977 | Heagerty et al. ............... 257/354 |
| 4,484,209 | 11/1984 | Uchida ............................ 257/353 |
| 4,489,339 | 12/1984 | Uchida ............................ 257/353 |
| 4,809,056 | 2/1989 | Shirato et al. .................. 257/347 |
| 5,001,528 | 3/1991 | Bahraman ....................... 257/352 |
| 5,079,604 | 1/1992 | Houston et al. ................. 257/66 |
| 5,125,007 | 6/1992 | Yamaguchi et al. ............. 257/349 |
| 5,160,989 | 11/1992 | Houston ........................... 257/349 |

FOREIGN PATENT DOCUMENTS

| | | | |
|---|---|---|---|
| 52-48475 | 4/1977 | Japan | 257/349 |
| 57-27068 | 2/1982 | Japan | 257/347 |
| 63-76379 | 4/1988 | Japan | 257/349 |

*Primary Examiner*—Rolf Hille
*Assistant Examiner*—Steven Loke
*Attorney, Agent, or Firm*—Charles E. Wands

[57] ABSTRACT

An SOI/SOS thin film MOS mesa architecture has its body/channel region extended beyond the source and drain regions and the impurity concentration is increased at an end portion of the extended body region, so as to provide a channel stop region that is effective to functionally interrupt a current leakage path or 'parasitic' N-channel that may be induced along sidewall surface of the P-type material of the body/channel region. In addition, in order to inhibit radiation-induced leakage along a backside interface of the extended body region abutting an underlying dielectric substrate, a portion of the extended body region between the channel stop region and the body/channel region has an impurity concentration profile that is increased at the interface of the extended body region with the underlying dielectric substrate.

17 Claims, 4 Drawing Sheets

SOI CMOS DEVICE HAVING DIFFERENTIALLY DOPED BODY EXTENSION FOR PROVIDING IMPROVED BACKSIDE LEAKAGE CHANNEL STOP

FIELD OF THE INVENTION

The present invention relates in general to semiconductor devices and is particularly directed to an SOS/SOI architecture, the channel/body portion of which has a differentially doped tab portion extending beyond the source and drain regions, so as to serve as a channel stop against both 'sidewall' parasitic transistor action between the source and drain regions and to reduce ionizing radiation-induced leakage along the interface between the channel extension tab and the insulator layer with which the channel extension tab is contiguous.

BACKGROUND OF THE INVENTION

Co-pending application Ser. No. 780,251, filed Oct. 21, 1991, entitled "SOI/SOS CMOS DEVICE HAVING BODY EXTENSION FOR PROVIDING SIDEWALL CHANNEL STOP AND BODYTIE" by R. Cherne et al, assigned to the assignee of the present application and the disclosure of which is herein incorporated, addresses parasitic channel/leakage problems associated with thin co-planar integrated circuits that employ silicon-on-insulator (SOI) or silicon-on-sapphire (SOS) CMOS architectures. As described in that application, such structures are typically characterized by the use of either air or oxide dielectric to provide lateral isolation between adjacent 'mesa' transistors which are formed atop an insulating dielectric (e.g. silicon oxide or sapphire).

In particular, as diagrammatically illustrated in the top view of FIG. 1 and the side view of FIG. 2, a conventional N-channel SOI/SOS thin film MOS transistor structure is typically comprised of a semiconductor (silicon) mesa layer 11, which is disposed atop a substrate-supported dielectric (silicon dioxide) layer 12 and the sidewall perimeter of which is bounded by air or an oxide dielectric layer, shown at 13. This semiconductor mesa structure contains a P-type body/channel region 14 disposed between and immediately contiguous with respective N+ source and drain regions 16 and 18. Overlying the (P-type) channel/body region 14 and extending onto the surrounding support substrate, either co-planar with the top of the mesa as shown in FIG. 2 in the case where the mesa is bounded by an oxide dielectric layer 13, or stepped down to the surface of dielectric layer 12 in the case where the mesa is bounded by air isolation, is a doped polysilicon gate layer 21, insulated from the semiconductor material of the mesa by a thin dielectric layer (e.g. oxide) 22.

In dielectric bounded architectures, a backside MOS parasitic device is formed where the drain and source regions terminate at the underlying insulator layer. Since the insulator layers are normally considerably thicker than the active gate oxide, for relatively similar doping levels the voltage necessary to cause inversion at the surface of the dielectric is typically large enough, so that under normal ambient operating conditions there is little problem of parasitic leakage.

However, when the device is required to operate in an environment where large quantities of ionizing radiation (e.g. X-rays or gamma rays) are present, electron-hole pairs are generated in the underlying dielectric. Although most of these electron-hole pairs quickly recombine and the highly mobile remaining electrons are rapidly drawn away from the insulator, slower moving holes remain trapped so as to add positive charge, which reduces the N-channel threshold voltage of the device. As the thick oxide threshold voltages are reduced to approach the value of the circuit's power supply, source-to-drain leakage increases, thereby degrading the integrated circuit's performance and, eventually, the circuit may even be rendered non-functional.

Thus, in the device shown in FIGS. 1 and 2, the surface of P-doped material (here the P-type channel/body region 14) is susceptible to inversion in the presence of ionizing radiation, so that there is the danger of a leakage path or 'parasitic' channel being induced along the body/channel sidewalls 23, 24 between the source and drain regions 16, 18. Moreover, regardless of the potential for exposure to ionizing radiation, the inability of some manufacturing processes to accurately control the channel doping along the edges of the device (beneath the polysilicon gate overlay 21), and the lack of control of electrostatic charge build-up along surface portions 25, 27 of dielectric layer 13 that is immediately adjacent to P-type silicon body 14, may cause the device to suffer extraordinary current leakage in its OFF state.

Several methods have been employed to harden SOI thick oxides and other dielectric materials against total dose radiation. For example, the back gate N-channel can be heavily doped by high energy implantation of dopants to produce retrograde well impurity profiles. In more advanced technologies having a mesa thickness less than a half micron, it becomes increasingly more difficult to obtain the necessary back-to-front concentration gradient and keep the active device decoupled from the backside doping, which severely limits the effectiveness of a well dopant retrograding approach in then SOI transistor architectures.

Applying a large negative bias voltage (greater or equal to negative 5 volts) to the substrate can also help keep the backside interface in an accumulation state. However, the most universally accepted biasing scheme involves grounding the substrate. This constraint is due to the lack of a power supply rail in most digital military and aerospace electronic subsystems.

Heavily doped P-type channel stops and guard rings, source and/or drains diffusions spaced apart from the device side edge, and edgeless or circular gate circuit layouts have been used to reduce or eliminate sidewall leakage. These techniques either require considerably greater layout area to implement the circuit, or they limit the transistor to unidirectional current flow by permanently linking the device source to its body.

In accordance with the invention described in the above-referenced co-pending application, the above discussed leakage problems of conventional SOI/SOS thin film MOS mesa architectures may be effectively obviated by extending the body/channel region to form a 'tab' channel stop. In accordance with one embodiment of the 'tab' channel stop configuration, diagrammatically illustrated in the respective top and side views of FIGS. 3 and 4, respectively, the conventional thin mesa transistor structure of FIGS. 1 and 2 is modified such that the body/channel region 14 extends beyond its interfaces with each of the source and drain regions, as shown by body/channel extension regions or segments 31, 32. Regions 31, 32 have a prescribed width x and a length y within the dimensions of the gate layer 21 and serve to increase the effective channel width of body/channel region 14 to a value greater than the case where the body/channel region terminates 'flush' with source and drain regions 16, 18 (as shown in FIG. 1). The respective channel/body extensions 31, 32 at both ends of the body/channel region beneath the polysilicon gate, by increasing the 'net edge length' (2x+y), can be expected to reduce OFF state leakage due to the attenuation of parasitic transistor short channel effects.

The channel extension tab configuration may be enhanced by increasing the doping concentration of the tabs at their outer extremities, as diagrammatically illustrated in FIGS. 5 and 6, which show respective top views of a channel tab extension architecture, in which respective high impurity concentration implants 41, 42 overlap end, channel stop, portions 43, 44 of (P-type) body/channel extension regions 31, 32, whereby the impurity concentration of these end portions of the extension regions is increased relative to the impurity concentration of that portion 17 of the body/channel region 14 disposed between the source and drain regions, thereby forming a pair of P+ channel stops. This relatively high impurity concentration of the channel stop regions 43, 44 insures that the parasitic sidewall threshold is higher than any possible negative threshold shift which might be induced by ionizing radiation. These more heavily doped (P+) channel stop regions 43, 44 of the extension regions 31, 32 are spaced apart from the endwall edges of source and drain regions 16, 18 by respective portions 51, 52 of the extension regions 31, 32 of the same doping concentration as the body/channel region 14 itself, so that the more heavily doped (P+) channel stop regions 43, 44 do not form (very low breakdown voltage) P+/N+ junctions with the source and drain regions 16, 18. The source and drain regions may be formed by an N+ implant using an implant mask the geometry of which overlaps polysilicon gate layer 21, shown at 55 in FIG. 6.

Now although the incorporation of channel extension tabs is very effective in eliminating the problem of sidewall leakage, it has been found to contribute to a reduction in radiation hardness of the back gate extension. With reference to the extended channel architecture shown in perspective in FIG. 7 and in plan in FIG. 8, the buried dielectric layer 12 underneath the intermediate or buffer portion 51 of the channel extension has been found to exhibit a total ionizing dose response, which is degraded compared with SOI transistor structures that do not have an extended channel configuration. A localized reduced threshold voltage and an increased post irradiation threshold voltage shift, consequently, an earlier onset of a secondary radiation-induced leakage has been observed along this interface.

SUMMARY OF THE INVENTION

In accordance with the present invention, such radiation-induced leakage along the interface of the channel extension between the channel and the outer, increased impurity concentration region channel stop portion of the extension can be successfully counteracted by tailoring the impurity concentration in the intermediate/buffer portion of the channel extension region, so that the impurity concentration is increased along the backside interface between the bottom of the extension and the underlying insulator, forming an increased magnitude, retrograde doping profile having its peak value at the interface.

For this purpose, the implant energy and dosage of a selective P+ (e.g. boron) implant are controlled such that the peak of the increased magnitude doping profile in the intermediate portion of the extension occurs at the buried insulator/mesa silicon interface, thereby compensating the localized reduced threshold voltage of the intermediate or buffer portion of the extension to match that of the remaining backside MOS structure. A net increase in the impurity concentration along the upper or topside portion of the channel extension may also take place. However, since this topside portion of the channel extension is outside the active channel region, the device threshold is not adversely affected. The enhanced doping concentration is still low enough to avoid a drain-to-body junction breakdown problem.

DETAILED DESCRIPTION

Figure 1:
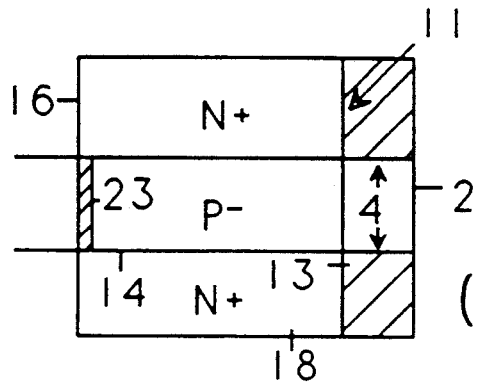
FIGS. 1 and 2 are respective diagrammatic top and side views of conventional N-channel SOI/SOS thin film MOS transistor structure.
Figure 2:
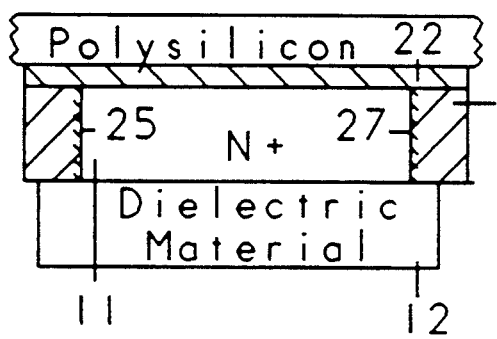
Figure 3:
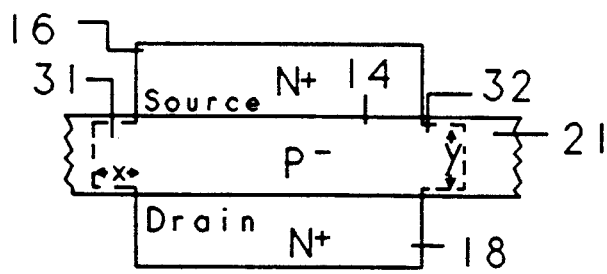
FIGS. 3 and 4 are respective diagrammatic top and side views of an MOS transistor structure having body/channel extension regions in accordance with an embodiment of the invention described in the above-referenced, co-pending Cherne et al application.
Figure 4:
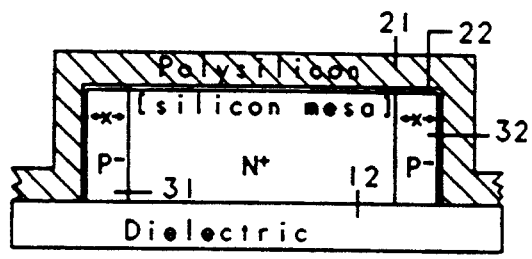
Figure 5:
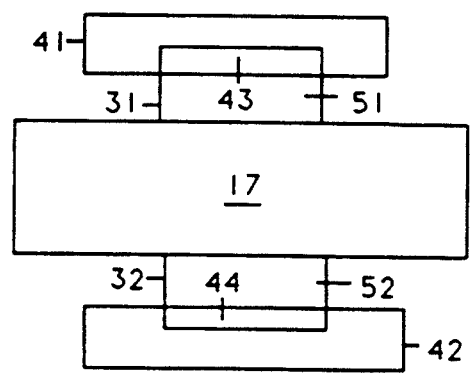
FIGS. 5 and 6 are respective diagrammatic top and side views of an MOS transistor structure having body/channel extension regions in accordance with another embodiment of the invention described in the above-referenced, co-pending Cherne et al application.
Figure 6:
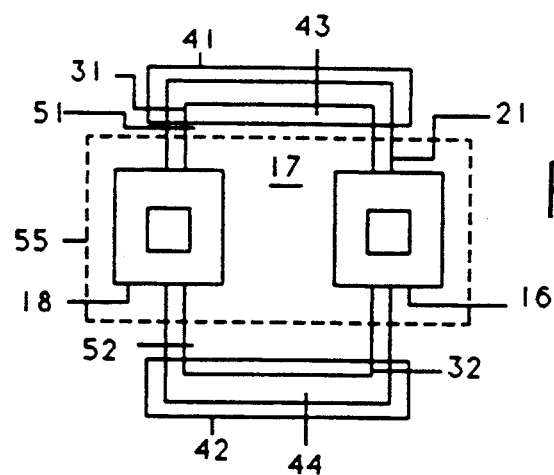
Figure 7:
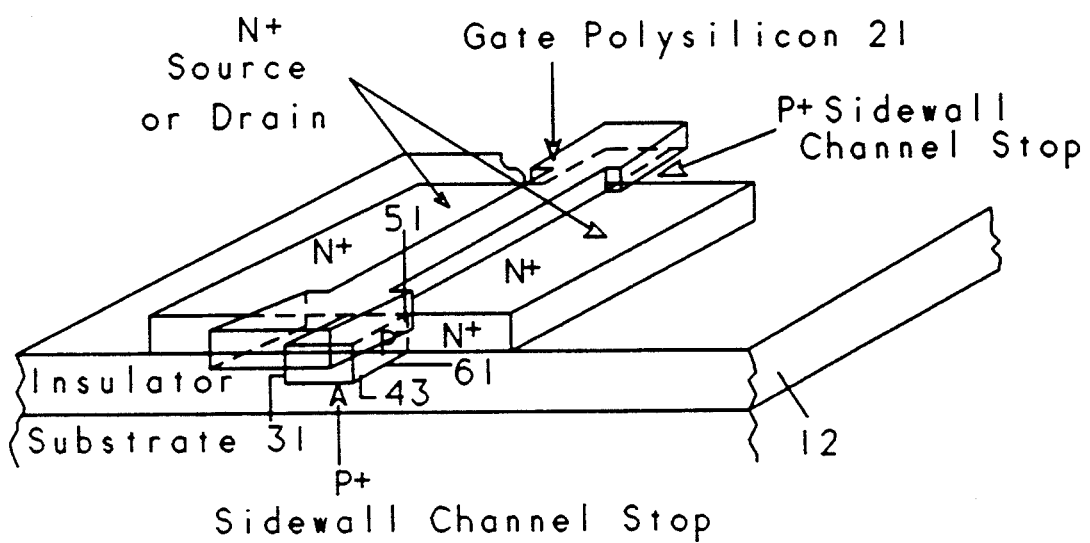
FIGS. 7 and 8 are perspective and plan views, respectively, of an extended channel MOS transistor showing the interface between a buried dielectric layer and an intermediate portion of the channel extension.
Figure 8:
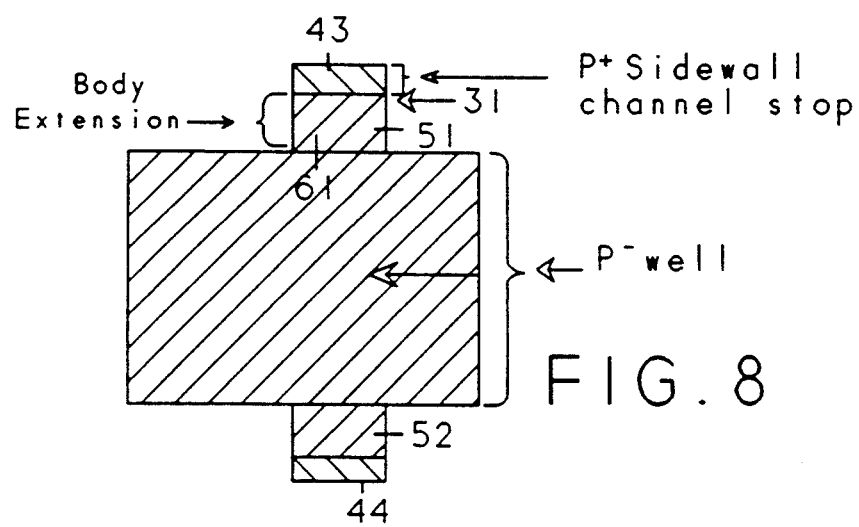

As described above with reference to FIGS. 7 and 8, the buried dielectric layer 12 underneath the intermediate portion 51 of the channel extension between the channel 14 and the heavily doped channel stop region 43 has been found to exhibit a total ionizing dose response, which is degraded compared with SOI transistor structures that do not have an extended channel configuration. A reduced localized threshold voltage and an increased post irradiation threshold voltage shift, therefore, an earlier onset of secondary radiation-induced leakage has been observed along the underlying interface 61 between intermediate portion 51 and buried insulator layer 12.

Figure 9:
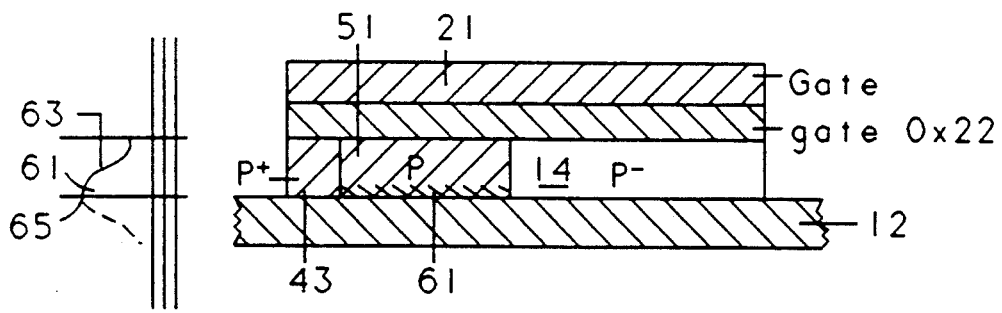
FIG. 9 is a partial side view of an extended channel MOS transistor showing the doping augmentation of an intermediate portion of the extended channel in accordance with the present invention.

With reference to FIG. 9, pursuant to the invention, such backside radiation-induced leakage is successfully counteracted by increasing the dosage along interface 61 and tailoring the resultant increased impurity concentration in the intermediate portion 51 of the channel extension region, so that the impurity concentration is increased in a retrograde manner at the lowermost portion of the channel extension region alongside its interface with the underlying insulator material, namely immediately adjacent to the bottom 61 of the intermediate portion of the channel extension.

For this purpose, the implant energy and dose of a selective P+ (e.g. boron) implant into the intermediate portion 51 of the channel extension region are controlled such that the doping level in region 51 is increased relative to the P- channel and, as shown diagrammatically by the doping profile 63 in FIG. 9, its peak 65 occurs at the buried insulator/mesa silicon interface 61, thereby compensating the localized reduced threshold voltage of the intermediate portion of the extension to match that of the remaining backside MOS structure. For a typical mesa-based MOS architecture, the peak dosage may fall in a range on the order of $5 \times 10^{17} - 5 \times 10^{18}$ cm$^{-3}$, with a nominal peak value on the order of $1 \times 10^{18}$ cm$^{-3}$ at the buried insulator/mesa silicon interface 61.

As pointed out previously, due to the selective implantation of a P+ impurity (boron) for the purpose of increasing the impurity concentration of the bottom of intermediate portion 51 of the channel extension, a net increase in the impurity concentration along the upper or topside portion of the channel extension may also take place. However, since the topside portion of the channel extension is outside the active channel region 14, neither the device threshold nor the junction breakdown voltage is adversely affected.

As will be appreciated from the foregoing description, the present invention provides an enhancement to the extended body/channel MOS transistor architecture of the above referenced Cherne et al application, by controlling the impurity concentration profile in an intermediate portion of the channel extension, so as to effectively counteract radiation-induced leakage along the interface of the underlying dielectric substrate and the channel extension between the channel/body portion and the heavily doped channel stop region. Increasing the doping profile of the intermediate region along its backside interface with the underlying insulator is achieved by controlling implant energy and dosage of a selective P+ implant, such that the peak of the resultant increased magnitude doping profile in the intermediate portion of the extension occurs at the buried insulator/mesa silicon interface, thereby compensating the reduced localized threshold voltage of the intermediate portion of the extension to match that of the remaining backside MOS structure. Even though a net increase in the impurity concentration along the upper or topside portion of the channel extension may also take place, because this topside portion of the channel extension is outside the active channel region, the device threshold is not adversely affected. The enhanced doping concentration is still low enough to avoid a drain-to-body junction breakdown problem.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cove all such changes and modifications as are obvious to one of ordinary skill in the art.

What is claimed is:

1. A semiconductor device comprising:
    a substrate;
    a first semiconductor region of a first conductivity type formed on a first substrate portion of said substrate;
    a second semiconductor region of a second conductivity type formed on a second surface portion of said substrate contiguous with said first surface portion, so as to form a first junction with said first semiconductor region, said first junction having a first length along said first semiconductor region;
    a third semiconductor region of said second conductivity type formed on a third surface portion of said substrate, spaced apart from said second surface portion by said first surface portion therebetween, and being contiguous with said first portion, so as to form a second junction with said first semiconductor region, said second junction having a second length along said first semiconductor region;
    a layer of conductive material overlying said first semiconductor region, said layer of conductive material being insulated from said first semiconductor region by a layer of insulating material therebetween; and
    said first semiconductor region being configured to include at least one extension region beyond said second and third semiconductor regions underlying said layer of conductive material, and wherein a portion of said at least one extension region underlying said layer of conductive material has an impurity distribution profile that is increased along the interface of said portion of said at least one extension region with said substrate relative to a top surface of said at least one extension region.

2. A semiconductor device according to claim 1, wherein an end portion of said at least one extension region has an impurity concentration greater than the impurity concentration of another portion thereof adjacent to said first semiconductor region.

3. A semiconductor device according to claim 1, wherein an end portion of said at least one extension region includes a heavily doped region the impurity concentration of which is greater than that of said portion of said at least one extension region having an impurity distribution profile that is increased along the interface of said portion of said at least one extension region with said substrate relative to said top surface of said at least one extension region.

4. A semiconductor device according to claim 1, wherein said substrate includes a layer of insulating material upon which said first semiconductor region is disposed.

5. A semiconductor device according to claim 1, wherein the impurity distribution profile of said portion of said at least one extension region has its peak concentration at the interface of said portion of said at least one extension region with said substrate.

6. A field effect transistor device comprising:
    a dielectric substrate;
    a field effect transistor structure disposed on said dielectric substrate, said field effect transistor structure including a body region of a first conductivity type formed on a first surface portion of said dielectric substrate, a source region of a second conductivity type formed on a second surface portion of said dielectric substrate contiguous with said first surface portion and forming a source/body junction with said body region, said source/body junction having a first length along said body region, a drain region of said second conductivity type formed on a third surface portion of said dielectric substrate, spaced apart from said second surface portion by said first surface portion therebetween, and being contiguous with said first surface portion and forming a drain/body junction with said body region, said drain/body junction having a second length along said body region, and a gate layer insulated from and overlying said body region for inducing therein a channel region between said source and drain regions, and wherein said body region extends beyond said source and drain regions as at least one body extension region underlying said gate layer, and wherein a portion of said at least one body extension region underlying said gate layer has an impurity distribution profile that is increased along the interface of said portion of said at least one body extension region with said dielectric substrate relative to a top surface of said at least one body extension region.

7. A field effect transistor device according to claim 6, wherein an end portion of said at least one body extension region has an impurity concentration greater than the impurity concentration of another portion thereof adjacent to that portion of said body region between said source and drain regions, so as to form a channel stop region at said end portion.

8. A field effect transistor device according to claim 6, wherein said at least one body extension region comprises first and second body extension regions at opposite ends of said body region.

9. A field effect transistor device according to claim 6, wherein the impurity distribution profile of said portion of said at least one body extension region has its peak concentration at the interface of said a portion of said at least one body extension region with said dielectric substrate.

10. A field effect transistor device according to claim 6, wherein an end portion of said at least one body extension region includes a heavily doped region the impurity concentration of which is greater than that of said portion of said at least one body extension region having an impurity distribution profile that is increased along the interface of said portion of said at least one extension region with said dielectric substrate, relative to said top surface of said at least one body extension region, so as to form a channel stop region at said end portion.

11. A mesa field effect transistor architecture comprising:
    a dielectric support substrate;
    a mesa field effect transistor structure disposed on said dielectric support substrate, said mesa field effect transistor structure including a body mesa region of a first conductivity type formed on a first surface portion of said dielectric support substrate, a source mesa region of a second conductivity type formed on a second surface portion of said dielectric support substrate contiguous with said first surface portion and forming a source/body junction with a first sidewall of said mesa body region, a drain mesa region of said second conductivity type formed on a third surface portion of said dielectric support substrate, spaced apart from said second surface portion by said first surface portion therebetween, and being contiguous with said first surface portion and forming a drain/body junction with a second sidewall of said body region, and a gate layer overlying said mesa body region for inducing therein a channel region between said source and drain mesa regions, said body mesa region extending beyond said source and drain mesa regions as at least one extension mesa region underlying said gate layer, and wherein a first end portion of said at least one extension mesa region underlying said gate layer has an impurity concentration greater than the impurity concentration of a portion of said body mesa region disposed between said source and drain mesa regions, so as to form a mesa sidewall channel stop, and wherein a portion of said at least one extension mesa region underlying said gate layer between said first end portion thereof and said channel region has an impurity concentration profile that is increased along the interface of said portion of said at least one extension mesa region with said dielectric support substrate relative to a top surface of said at least one extension mesa region.

12. A mesa field effect transistor architecture according to claim 11, wherein said at least one extension mesa region comprises first and second mesa extension regions at opposite ends of said body mesa region, and wherein end portions of said first and second mesa extension region have an impurity concentration greater than the impurity concentration of a portion of said body mesa region disposed between said source and drain mesa regions, so as to form first and second mesa sidewall channel stops.

13. A mesa field effect transistor architecture according to claim 12, wherein the impurity distribution profile of that portion of said at least one mesa extension region disposed between said source and drain mesa regions has its peak concentration at the interface of said portion of said at least one mesa extension region with said dielectric support substrate.

14. A method of inhibiting radiation-induced leakage along an interface of an N-channel field effect transistor with an underlying dielectric substrate upon which said N-channel field effect transistor is disposed, said N-channel field effect transistor including a P-type body region disposed on a first surface portion of said dielectric substrate, an N-type source region disposed on a second surface portion of said dielectric substrate contiguous with said first substrate portion and forming a source/body PN junction with said P-type body region, said source/body PN junction having a first length along said P-type body region, an N-type drain region formed on a third surface portion of said dielectric substrate, spaced apart from said second surface portion by said first surface portion therebetween, and being contiguous with said first surface portion and forming a drain/body PN junction with said P-type body region, said drain/body PN junction having a second length along said P-type body region, and a gate layer insulated from and overlying said P-type body region for inducing therein an N-channel region between said source and drain regions, comprising the steps of:
    (a) extending said P-type body region beyond said source and drain regions as at least one P-type extension region underlying said gate layer; and
    (b) causing a portion of said at least one P-type extension region underlying said gate layer to have an impurity distribution profile that is increased along the interface of said portion of said at least one P-type extension region with said dielectric substrate relative to a top surface of said at least one P-type extension region.

15. A method according to claim 14, wherein step (b) comprises controlling the impurity concentration of a portion of said at least one P-type extension region adjacent to said portion of said P-type body region disposed between said source and drain regions to have said impurity distribution profile that is increased along the interface of said portion of said at least one P-type extension region with said dielectric substrate relative to said top surface of said at least one P-type extension region.

16. A method according to claim 14, further including the step (c) of causing an end portion of said at least one P-type extension region to have an impurity concentration greater than the impurity concentration of another portion thereof adjacent to that portion of said P-type body region between said N-type source and drain regions, so as to form a channel stop region at said end portion.

17. A method according to claim 14, wherein step (b) comprises causing the impurity distribution profile of said portion of said at least one P-type body extension region to have its peak impurity concentration at the interface of said portion of said at least one P-type body extension region with said dielectric substrate.

* * * * *